United States Patent [19]

Weiss et al.

[11] Patent Number: 4,971,931
[45] Date of Patent: Nov. 20, 1990

[54] DIFFUSER FEATURES FOR SPIN-COATED FILMS

[75] Inventors: Armin K. Weiss; Goodwin Ting, both of Rochester, N.Y.

[73] Assignee: Eastman Kodak Company, Rochester, N.Y.

[21] Appl. No.: 479,011

[22] Filed: Feb. 12, 1990

[51] Int. Cl.$^5$ .................................... H01L 21/027
[52] U.S. Cl. .................... 437/231; 437/229; 430/320; 430/935; 430/311
[58] Field of Search ............. 430/311, 935, 320; 437/231, 228, 229

[56] References Cited

U.S. PATENT DOCUMENTS

| | | | |
|---|---|---|---|
| 4,069,076 | 1/1978 | Fickes | 430/935 |
| 4,103,064 | 1/1978 | McAlear et al. | 437/229 |
| 4,267,212 | 5/1981 | Sokawaki | 430/935 |
| 4,315,985 | 2/1982 | Castellani et al. | 430/935 |
| 4,738,910 | 4/1988 | Ito et al. | 430/935 |
| 4,767,695 | 8/1988 | Ong et al. | 430/311 |

FOREIGN PATENT DOCUMENTS

| | | | |
|---|---|---|---|
| 60-74624 | 4/1985 | Japan | 430/935 |
| 60-115224 | 6/1985 | Japan | 430/935 |
| 60-130830 | 7/1985 | Japan | 430/935 |
| 63-128628 | 6/1988 | Japan | 430/935 |
| 63-133526 | 6/1988 | Japan | 430/935 |

Primary Examiner—Brian E. Hearn
Assistant Examiner—Gordon V. Hugo
Attorney, Agent, or Firm—Raymond L. Owens

[57] ABSTRACT

In forming integrated circuits on a wafer, diffuser features are provided adjacent to topographic features so that when a film is formed by spin-coating a liquid precursor over the integrated circuits, the action of the spreading liquid relative to the diffuser features in proximity to topographic features minimizes radial streaks which would have been caused by the topographic features.

3 Claims, 3 Drawing Sheets

DIFFUSER FEATURES FOR SPIN-COATED FILMS

FIELD OF THE INVENTION

The present invention relates to reducing radial streaking in a film formed on a support by spin-coating a liquid precursor.

BACKGROUND OF THE INVENTION

The fabrication of solid-state devices like integrated circuits or image sensors generally proceeds from a microscopically smooth semiconductive wafer through a series of processing steps, such as oxide growth, ion implantation, metal deposition, passivation, etc. Some of these processing steps involve patternwise definition of materials, either during deposition or by pattern-selective removal. Due to such patternwise definition of materials throughout the fabrication sequence, a finished wafer containing a plurality of integrated circuits or image sensors is no longer microscopically smooth, but has topographic features of varying height or depth and of varying lateral dimensions.

When a film is deposited by spin-coating from a liquid precursor on a wafer with such topographic features, the film may exhibit thickness variations extending radially outwardly from major topographic features such as bond pads or test structures. Such radially-directed thickness variations will be referred to as radial streaks.

For a given topographic feature, defined by its lateral dimensions and its height or depth relative to a mean level, the severity of radial streaks originating from said topographic feature increases as the intended thickness of the spin-coated film decreases. For example, few or no radial streaks are generally observed in a film coated on a support with topographic features if the film thickness is 10x of the vertical dimension of the topographic feature. Such a film is said to be a planarizing film. However, if the intended film thickness is 0.1x of the vertical dimension of the topographic feature, the topographic feature functions as a streak-inducing feature and severe radial streaks are often observed in that film. Major topographic features of integrated circuits or image sensors can have vertical dimensions ranging from about 0.2 micrometers to about 10 micrometers. Thus, it will be appreciated that a film coated at 0.25 micrometers intended thickness over a 0.75 micrometer vertical feature can exhibit similarly severe radial streaks as a film coated at 3 micrometers intended thickness over a 9 micrometer vertical feature.

When the film, spin-coated from a liquid precursor, has designated regions to be permanently retained over portions of the integrated circuit or image sensor as an optical or dielectric element, radial streaks in the film can render the device useless.

SUMMARY OF THE INVENTION

It is an object of this invention to produce spin-coated films with reduced radial streaking over topographic features on a support.

This object is achieved in a method of forming a plurality of integrated circuits on a wafer, with topographic features such as bond pads and test structures associated with each integrated circuit, the improvement comprising:

(a) forming the integrated circuits and associated topographic features on a wafer;

(b) providing diffuser features in proximity to topographic features;

(c) spin-coating from a liquid precursor a film with designated permanent regions over the integrated circuits so that the action of the spreading liquid relative to the diffuser features in proximity to topographic features minimizes radial streaks which would have been caused by the topographic features; and (d) patterning the designated permanent regions of the film.

An advantage of this invention is that the diffuser features in proximity to major streak-inducing topographic features can be formed simultaneously with forming the major topographic features.

Another advantage of this invention is that the diffuser features can be designed to minimize radial streaks emanating from major topographic features, by selecting sizes, shapes and frequencies of the diffuser features in proximity to said major topographic features.

A still further advantage of this invention is that the diffuser features can be arranged in groupings, such as regions, zones or bands, such groupings being located in proximity to major streak-inducing topographic features.

Still another advantage of the invention is that diffuser features can be formed in each successive spin-coated film, if successive spin-coated films are required.

It has been discovered that a film formed by spin-coating from a liquid precursor on a support with topographic features has reduced severity of radial streaks if diffuser features are placed in proximity to such topographic features.

A measure of the severity of radial streaks in a film, emanating from topographic features in the underlying surface, is the linear length of a streak, measured in a radial direction from the origin at the topographic feature to a point where the streak can no longer be observed with suitable detection methods.

BRIEF DESCRIPTION OF THE DRAWINGS

The invention can be better appreciated by reference to the following preferred embodiments considered in conjunction with the drawings, in which.

MODES OF CARRYING OUT THE INVENTION

Figure 1:
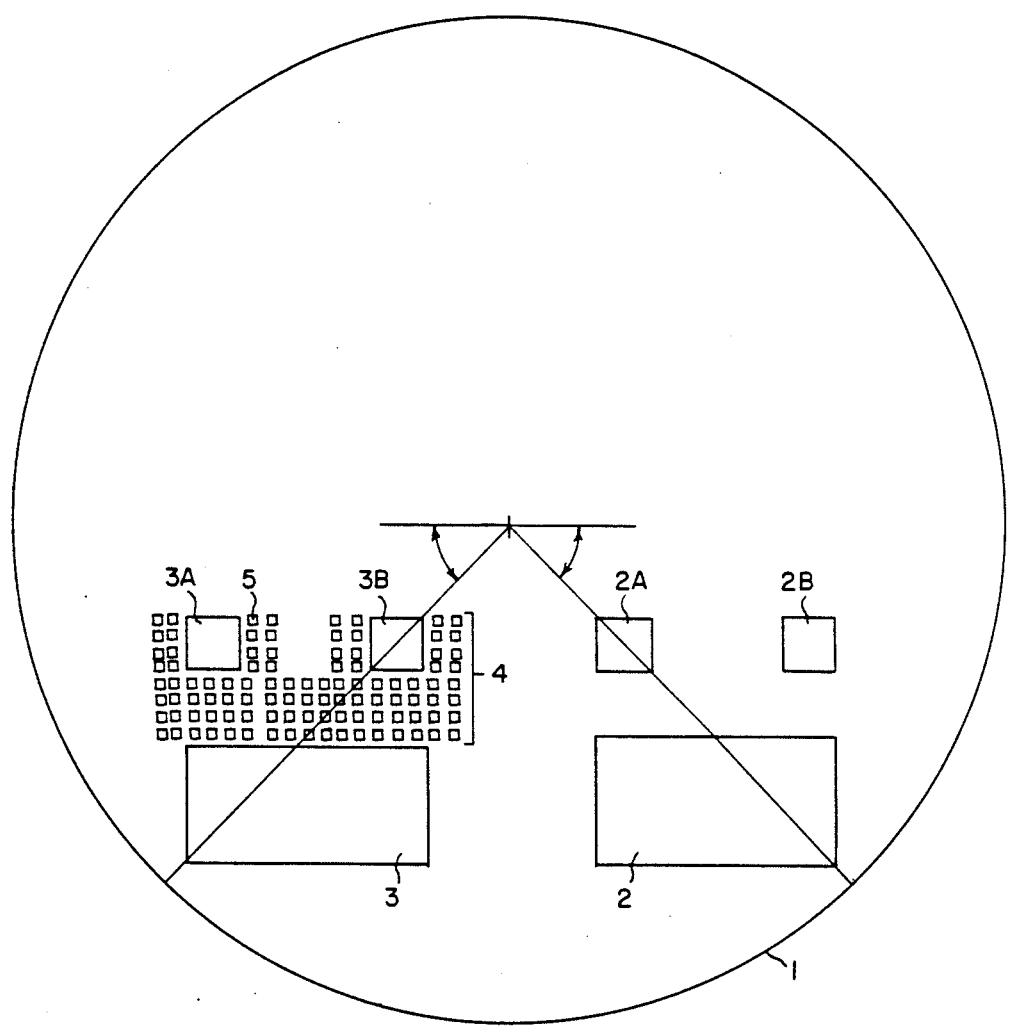
FIG. 1 is a plan view of a wafer support depicting two image sensor with associated major topographic features, wherein the major topographic features of one image sensor are in proximity to a grouping of diffuser features.

In FIG. 1 a semiconductor wafer 1 is shown with one image sensor 2 and associated topographic features 2A and 2B, and another image sensor 3 with its associated topographic features 3A and 3B. Topographic features 3A and 3B are in proximity to a grouping of diffuser features 4, comprising closely-spaced squares 5 with each square having linear dimensions of ¼ of the linear dimensions of topographic features 3A and 3B.

Figure 2:
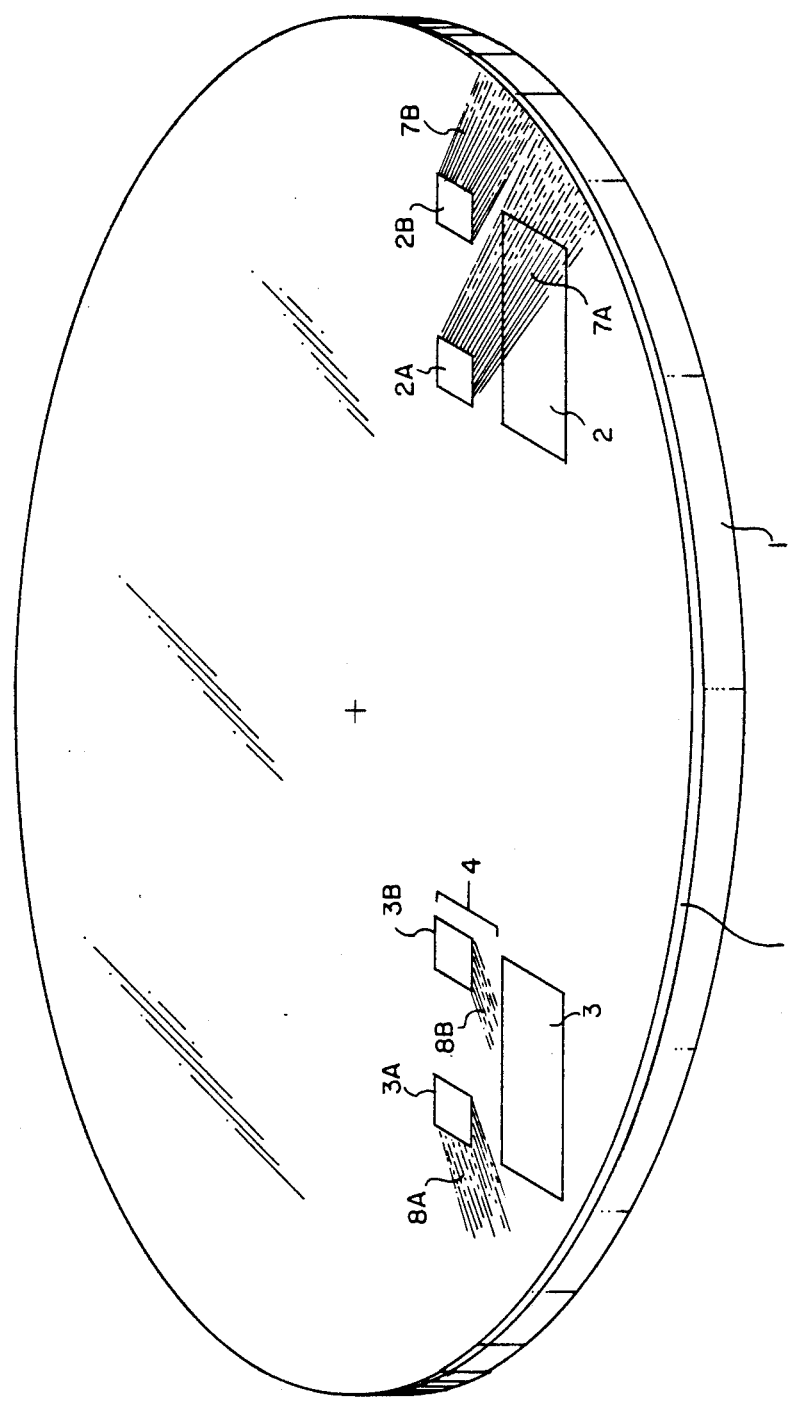
FIG. 2 is a perspective view of a film, spin-coated from a liquid precursor onto the wafer support of FIG. 1, depicting radial streaks emanating from the major topographic features of the underlying wafer support.

In FIG. 2 a film 6 has been deposited on wafer 1 by spin-coating from a liquid precursor, covering the entire wafer, including image sensors 2 and 3 and their associated topographic features 2A, 2B and 3A, 3B and grouping 4 (not shown) of the diffuser features 5 (not shown). Radial streaks 7A and 7B in the film 6 emanate in a radial direction from topographic features 2A and 2B, respectively, extending radially outwardly as a film thickness variation. Radial streak 7A extends across a portion of the entire surface of the image sensor 2.

The grouping 4 of diffuser features 5 surrounding topographic features 3A, 3B has diffused the radial streak 8B emanating from topographic feature 3B so effectively that this streak in the film 6 does not extend over the surface of image sensor 3. The radial streak 8A emanating from topographic feature 3A has been diffused less effectively because of fewer intercepting diffuser features 5 in its path. Thus, radial streak 8B is detectable beyond the boundary of grouping 4 of diffuser feature 5.

Figure 3:
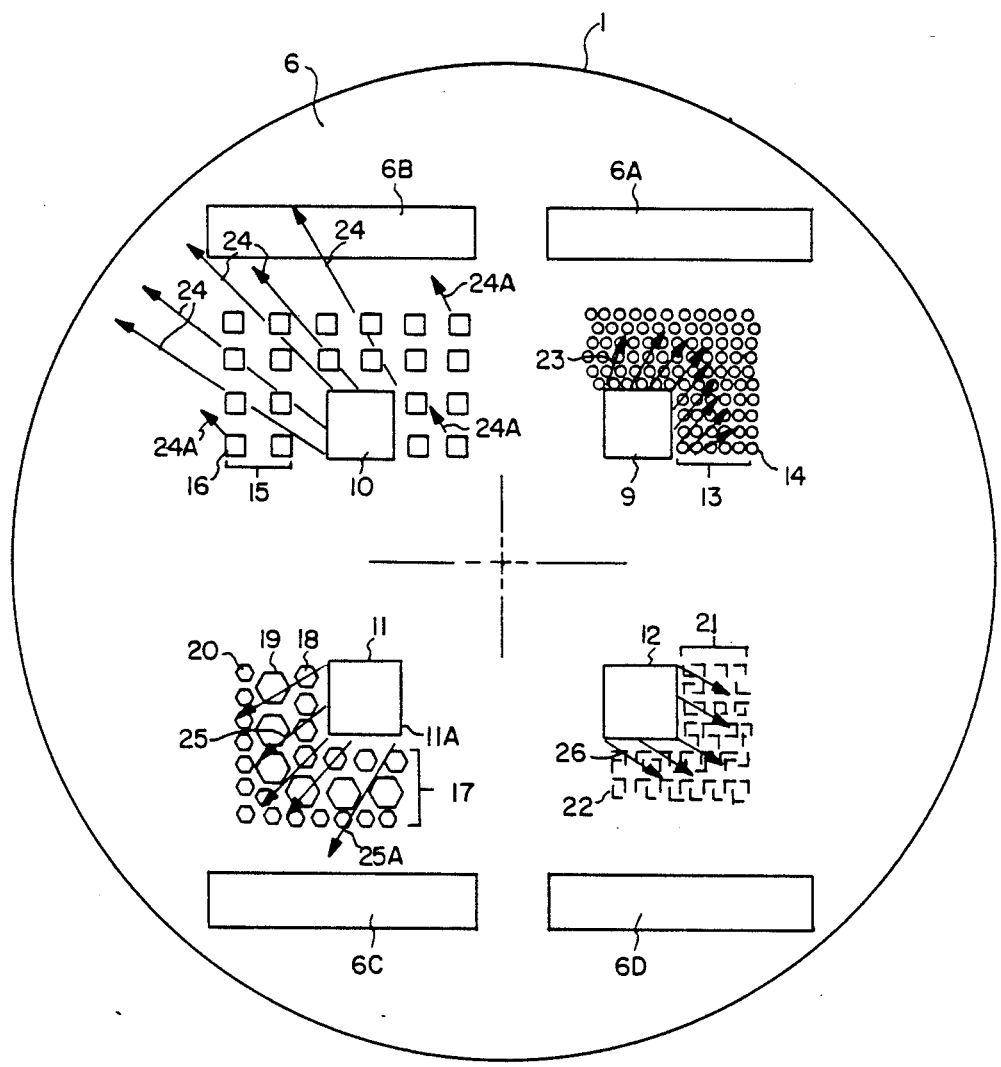
FIG. 3 is a plan view of a wafer support covered with a spin-coated film, depicting four major topographic features on said support under said film, wherein each topographic feature is associated with a grouping of diffuser features.

In FIG. 3 a film 6, with designated permanent regions 6A, 6B, 6C and 6D, has been deposited by spin-coating from a liquid precursor over the surface of a wafer support 1, the support comprising major topographic features 9, 10, 11 and 12. Topographic feature 9 is in proximity to a grouping 13 of small, closely adjacent circular diffuser features 14. Topographic feature 10 is in proximity to a grouping 15 of loosely adjacent square-shaped diffuser features 16. Topographic feature 11 is in proximity to a grouping 17 of closely adjacent hexagonal diffuser features 18, 19, 20 with diffuser features 18, each being all of one size; diffuser features 19, each being all of the same size, but larger than features 18; and diffuser features 20, each being all of the same size, but smaller than features 18. Topographic feature 12 is in proximity to a grouping 21 of small, closely adjacent, L-shaped diffuser features 22.

Radial streaks 23 in film 6 emanating from topographic feature 9 are effectively diffused by grouping 13 of diffuser features 14, thus not being observable in the designated permanent region 6A of film 6 radially outwardly from the boundary of grouping 13.

Radial streaks 24 in film 6, emanating from topographic feature 10 are not diffused effectively by grouping 15 of diffuser features 16, thus being readily observable in the designated permanent region 6B of film 6 radially outwardly from the boundary of grouping 15. Diffuser features 16 are of a size and spacing, that each diffuser feature causes a short radial streak 24A.

Radial streaks 25 in film 6, emanating from topographic feature 11 are diffused effectively by grouping 17 of diffuser features 18, 19, 20, thus not being observable in the designated permanent region 6C of film 6 radially outwardly from the boundary of grouping 17. Radial streak 25A is shown to extend radially outwardly beyond the boundary of grouping 17, depicting a narrow path devoid of intercepting diffuser features, said path originating from the corner 11A of topographic feature 11.

Radial streaks 26 in film 6, emanating from topographic feature 12 are effectively diffused by grouping 21 of diffuser features 22, thus not being observable in the designated permanent region 6D of film 6 radially outwardly from the boundary of grouping 21.

To demonstrate the effectiveness of various sizes, shapes and groupings of diffuser features in reducing the severity of radial streaks in a film that was deposited by spin-coating from a liquid precursor onto a wafer support surface containing major topographic features, the following test method was used:

A planar, semiconductive wafer with one smooth surface was processed to produce on the said smooth surface several major topographic features of equal lateral dimensions and equal vertical dimension. Simultaneously with producing the topographic features, diffuser features of varying size, shape, frequency were arranged in groupings, whereby a given grouping of diffuser features was located in proximity to one of the major topographic features. A diffuser feature can be either raised or recessed relative to a mean level of adjacent surfaces.

A liquid precursor of a film-forming material was then dispensed onto the surface of the wafer containing said topographic and diffuser features. The liquid was spread and transformed into a film by spinning the wafer about its center on a spin-coating apparatus. A designated region was patterned in the film radially outwardly from each topographic feature with its associated grouping of diffuser features.

The severity of radial streaks in the film extending from the topographic features radially outwardly was judged by viewing the film surface under monochromatic light at low magnification in an optical microscope. The length of a streak provided a measure of the severity of the radial streaks, or, conversely, a measure of the effectiveness of streak-reduction of the groupings of the diffuser features.

EXAMPLE 1

A test wafer was prepared so that one of its surfaces contained several arrangements of topographic features, all but one arrangement of topographic features being located in proximity to a grouping of diffuser features. One arrangement of topographic features was devoid of proximate diffuser features, serving as a radial streak reference.

All topographic features had lateral dimensions of about 160×100 micrometers and a vertical dimension of about 1 micrometer. The diffuser features within each grouping had the same size, shape and spacing from one another. All diffuser features had a vertical dimension of about 1 micrometer.

The test wafer was affixed to a rotatable platen of a spin-coating apparatus. A photoresist liquid was dispensed onto the surface of the wafer containing the topographic and diffuser features, and the wafer was spun at a speed such that a dry film of photoresist of about 0.15 micrometer thickness was formed, as measured in areas unaffected by topographic and diffuser features.

Designated permanent regions of the film were formed by photolithographic methods of patternwise exposure of the photoresist film to activating radiation, followed by wet development of the pattern constituting the designated permanent regions.

These permanent regions were located generally radially outwardly from the arrangements of topographic features with associated groupings of diffuser features, as indicated schematically in FIG. 3.

Examination of the designated permanent regions of the film by optical methods revealed that radial streaks of up to 10 millimeter in length were caused in the film by underlying topographic features devoid of proximate diffuser features.

By comparison, radial streaks were reduced to about 1 millimeter in length in the permanent region of the film, if the underlying topographic features were in proximity to groupings of loosely adjacent square-shaped diffuser features with lateral dimension of about 25×25 micrometer. Diffuser features are considered loosely adjacent if the closest lateral distance between two adjacent features is greater than twice the largest lateral dimension of identical diffuser features.

Radial streaks were not detectable in the permanent region of the film if the underlying topographic features were in proximity to groupings of closely adjacent diffuser features with lateral dimensions ranging from about 25×25 micrometer to about 5×5 micrometers, or of circular shapes with lateral dimensions in the range from about 25 micrometer to 5 micrometer in diameter. Diffuser features are considered closely adjacent if the closest lateral distance between two adjacent features is smaller than twice the largest lateral dimension of identical diffuser features.

EXAMPLE 2

A test wafer was prepared as in Example 1, except that the vertical dimension of the topographic features and the diffuser features was about 10 micrometer.

A photoresist liquid was dispensed and spin-coated to a film thickness of about 2.8 micrometer. Designated permanent regions were patterned in the film by a procedure similar to Example 1.

Optical examination of the designated permanent region of the film revealed radial streaks of up to 5 millimeter long, caused by underlying topographic features devoid of proximate diffuser features.

As in Example 1, radial streaks in designated permanent regions of the film were of significantly reduced length, where underlying topographic features were located in proximity to groupings of loosely adjacent diffuser features. Where closely adjacent diffuser features were used, radial streaks were not observable.

It has been found that the severity of radial streaks is reduced when the diffuser features have lateral dimensions smaller than one third of the largest lateral dimension of the streak-inducing topographic features, with preferred lateral dimensions of diffuser features being in the range of from one fifth to one fiftieth of the largest lateral dimensions of the topographic features.

The invention has been described in detail with particular reference to a certain preferred embodiment thereof, but it will be understood that variations and modifications can be effected within the spirit and scope of the invention.

We claim:

1. In a method of forming a plurality of integrated circuits on a wafer, in which topographic features such as bond pads and test structures are associated with each integrated circuit, the improvement comprising:
   (a) forming the integrated circuits and associated topographic features on a wafer;
   (b) providing diffuser features in proximity to topographic features;
   (c) spin-coating from a liquid precursor a film with designated permanent regions over the integrated circuits so that the action of the spreading liquid relative to the diffuser features in proximity to topographic features minimizes radial streaks which would have been caused by the topographic features; and
   (d) patterning the designated permanent regions of the film.

2. The method of claim 1 wherein the diffuser features in proximity to topographic features have lateral dimensions smaller than one third of the lateral dimensions of the topographic features, and wherein the vertical dimension of the diffuser features is at least 0.2 micrometers.

3. The method of claim 1 wherein the diffuser features are arranged in groups, zones or bands of closely spaced diffuser features, in proximity to at least one topographic feature.

* * * * *